(12) United States Patent
Daly et al.

(10) Patent No.: US 10,580,909 B2
(45) Date of Patent: Mar. 3, 2020

(54) SEMICONDUCTOR PHOTOMULTIPLIER WITH IMPROVED OPERATING VOLTAGE RANGE

(71) Applicant: SensL Technologies Ltd., County Cork (IE)

(72) Inventors: Paul Malachy Daly, County Cork (IE); John Carlton Jackson, County Cork (IE)

(73) Assignee: SENSL TECHNOLOGIES LTD., County Cork (IE)

( * ) Notice: Subject to any disclaimer, the term of this patent is extended or adjusted under 35 U.S.C. 154(b) by 0 days.

(21) Appl. No.: 15/689,135

(22) Filed: Aug. 29, 2017

(65) Prior Publication Data
US 2019/0067495 A1 Feb. 28, 2019

(51) Int. Cl.
| | | |
|---|---|---|
| *H01L 31/107* | (2006.01) | |
| *H01L 31/02* | (2006.01) | |
| *H01L 25/16* | (2006.01) | |
| *H01L 31/024* | (2014.01) | |
| *H01L 31/0224* | (2006.01) | |
| *G01T 1/24* | (2006.01) | |
| *H01L 27/144* | (2006.01) | |
| *H01L 31/0352* | (2006.01) | |

(52) U.S. Cl.
CPC ........ *H01L 31/02027* (2013.01); *G01T 1/248* (2013.01); *H01L 25/162* (2013.01); *H01L 25/167* (2013.01); *H01L 27/1446* (2013.01); *H01L 31/024* (2013.01); *H01L 31/02005* (2013.01); *H01L 31/022408* (2013.01); *H01L 31/03529* (2013.01); *H01L 31/107* (2013.01); *H01L 2224/131* (2013.01); *H01L 2924/1207* (2013.01); *H01L 2924/12043* (2013.01)

(58) Field of Classification Search
CPC ... H01L 25/162; H01L 25/167; H01L 25/165; G01T 1/248
See application file for complete search history.

(56) References Cited

U.S. PATENT DOCUMENTS

| | | | |
|---|---|---|---|
| 9,207,334 B1 | 12/2015 | Ito et al. | |
| 2006/0124832 A1 | 6/2006 | Harmon et al. | |
| 2012/0153423 A1 | 6/2012 | Lee | |
| 2013/0099100 A1* | 4/2013 | Pavlov | H01L 31/107 250/208.2 |
| 2013/0200477 A1* | 8/2013 | Sun | H01L 31/02240 257/431 |

OTHER PUBLICATIONS

International Search Report and Written Opinion for International Application No. PCT/EP2018/070088, dated Oct. 19, 2018, 12 pages.

* cited by examiner

*Primary Examiner* — Samuel A Gebremariam

(57) ABSTRACT

The present disclosure relates to a semiconductor photomultiplier comprising an array of interconnected microcells; wherein the array comprises at least a first type of microcell having a first junction region of a first geometric shape; and a second type of microcell having a second junction region of a second geometric shape.

28 Claims, 12 Drawing Sheets

SEMICONDUCTOR PHOTOMULTIPLIER WITH IMPROVED OPERATING VOLTAGE RANGE

FIELD OF THE INVENTION

The present disclosure relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SiPMs are semiconductor photon sensitive devices made up of an array of very small Geiger-mode avalanche photodiode (APD) cells on a semiconductor substrate such as silicon. An example 10×10 microcell array is shown in FIG. 1 of the accompanying drawings. Each cell is connected to one another to form one larger device with one signal output. The entire device size can be as small as 1×1 mm or much larger. FIG. 2 of the accompanying drawings is a schematic diagram of a conventional silicon photomultiplier.

APD cells vary in dimension from 10 to 100 microns depending on the mask used, and can have a density of up to 3000 microcells/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 μm wavelength, but has high multiplication noise. InGaAs (Indium Gallium Arsenide) detects to a maximum wavelength of 1.6 μm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 μm, requires cooling to reduce dark currents, and can achieve a very low level of excess noise.

Silicon avalanche diodes can function with breakdown voltages of 20 to 500V, typically. APDs exhibit internal current gain effect of about 100-1000 due to impact ionization, or avalanche effect, when a high reverse bias voltage is applied (approximately 20-200 V in silicon, depending on the doping profile in the junction). Silicon PhotoMultipliers or SiPMs can achieve a gain of $10^5$ to $10^6$ by using Geiger mode APDs which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event.

Noise ultimately imposes a limit on the smallest signal that can be measured. The main source of noise in an SiPM is the dark count rate (DCR), which is primarily due to thermally generated electrons that go on to create an avalanche in the high field region.

The onset of non-light sensitive edge breakdown places a limit on the useful operating voltage range of the avalanche photo diode. Sufficient over voltage (biasing beyond initial breakdown) is necessary in order that avalanche probabilities achieve levels that allow a substantial PDE to be achieved. When sufficient over voltage is not possible due to the onset of non-light sensitive edge breakdown then PDE is reduced from what the device is ultimately capable of achieving. The device may be limited in operating voltage to levels that may not allow high avalanche probabilities to be achieved within the device and the architecture's full potential may not realised.

There is therefore a need to provide a semiconductor photomultiplier which addresses at least some of the drawbacks of the prior art.

SUMMARY

Accordingly, the present disclosure relates to a semiconductor photomultiplier comprising:
an array of interconnected microcells; wherein the array comprises at least a first type of microcell having a first junction region of a first geometric shape; and a second type of microcell having a second junction region of a second geometric shape.

In one aspect, the microcells located at locations of the array which have within them a region where an electric field is above a predetermined level have a lower breakdown compared to the microcells located at locations of the array which have within them a region where the electric field is below a predetermined level. Advantageously, the predetermined level is in the range of 20 volts to 60 volts.

In a further aspect, the breakdown voltage of the microcells having lower breakdown voltage compared to the breakdown voltage of microcells having higher breakdown voltage is given by the equation:

$$\left(\frac{V_{SP}}{V_{BD}}\right) = \left[n^2 + 2.14n^{6/7} - (n^3 + 3n^{13/7})^{2/3}\right]$$

where
$V_{BD}$ is the breakdown Voltage of the microcells having higher breakdown;
$V_{SP}$ is the breakdown Voltage of the microcells having lower breakdown;

$n \sim = r_j/W_{DM}$;

where $W_{DM}$ is equal to a depletion width of a plane junction; and
$r_j$ is a radius of curvature of a junction.

In an exemplary aspect, one of the first type of microcell and the second type of microcell are located at first locations of the array while the other one of the first type of microcell and the second type of microcell are located at second locations of the array.

In another aspect, the first locations and the second locations are associated with different electric fields.

In one aspect, the electric field associated with one of the first and second locations is greater than the electric field associated with the 5 other one of the first and second locations.

In a further aspect, one or more microcells located at locations at an outer periphery of the array are associated with a higher electric field than one or more microcells which are not located at locations at the outer periphery of the array.

In one aspect, one or more microcells located at corner locations of an outer periphery of the array are associated with a higher electric field than one or more microcells which are not located at corner locations of the outer periphery of the array.

In another aspect, at least one of the first and second geometric shapes define an arcuate shape.

In one aspect, both the first and second geometric shapes define an arcuate shape.

In another aspect, the first and second geometric shapes define arcuate shapes of different radii.

In one aspect, locations of the array which have a higher electric field than other locations of the array are provided with microcells with junction regions of area greater that the junction regions of microcells located at the other locations.

In an exemplary aspect, locations of the array which have a higher electric field than other locations of the array are provided with microcells with junction regions of radii greater that the junction regions of microcells located at the other locations.

In one aspect, at least one of the first and second geometric shapes define an arcuate shape; while the other one of the first and second geometric shapes define a non-arcuate shape.

In an exemplary aspect, the first junction region and second junction region are associated with different breakdown voltages.

In a further aspect, the first junction region and second junction region have different levels of light sensitivity.

In an exemplary aspect, the microcells located at the first locations of the array have a lower light sensitivity compared to the microcells located at the second locations of the array.

In one aspect, the first junction region and second junction region have different levels of gain.

In a further aspect, the microcells located at the first locations of the array have a lower gain compared to the microcells located at the second locations of the array.

In another aspect, the first junction region and second junction region have different levels of capacitance.

In one aspect, the microcells located at the first locations of the array have a lower capacitance compared to the microcells located at the second regions of the array.

In an exemplary aspect, the transmittance associated with one or more layers of material covering the microcells located at the first locations is lower than the transmittance associated with one or more layers of material covering the microcells located at the second locations.

In one aspect, the arcuate shape comprises at least one of a cylindrical shape, and a spherical shape.

In another aspect, the arcuate shape has a predetermined radius.

In a further aspect, at least two of the microcells have junctions of arcuate shape with different radii.

In one aspect, the areas of the first junction region and the second junction region are different.

In a further aspect, the junction area of the microcell located at the first locations is less than the junction area of the microcell located at the second locations.

In one aspect, the junction area of at least two microcell located at the first locations are different.

The present disclosure also relates to a substrate comprising:
an array of interconnected microcells; wherein the array comprises at least a first type of microcell having a first junction region of a first geometric shape; and a second type of microcell having a second junction region of a second geometric shape.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

Figure 1:
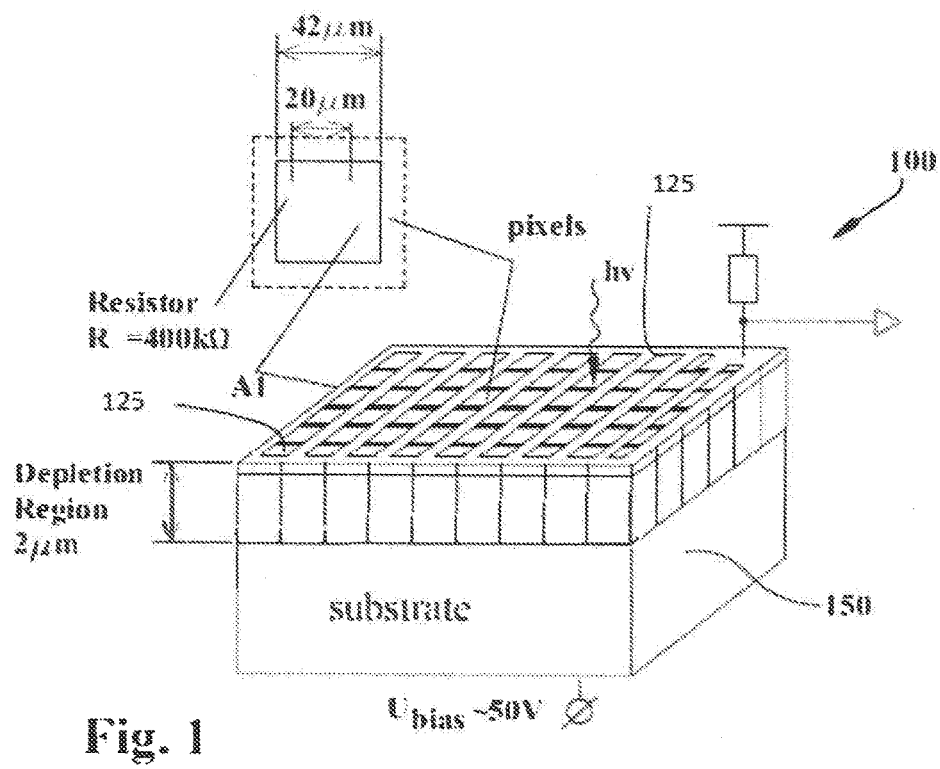
FIG. 1 illustrates an exemplary structure of a semiconductor photomultiplier.

The present disclosure will now be described with reference to some exemplary semiconductor photomultipliers. It will be understood that the exemplary semiconductor photomultipliers are provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Referring initially to FIG. 1, a semiconductor photomultiplier 100 comprising an array of Geiger mode photodiodes is shown. The array is formed on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode. As illustrated, a quench resistor is provided adjacent to 5 each photodiode which may be used to limit the avalanche current. The photodiodes are electrically connected to common biasing and ground electrodes by aluminum or similar conductive tracking.

Figure 2:
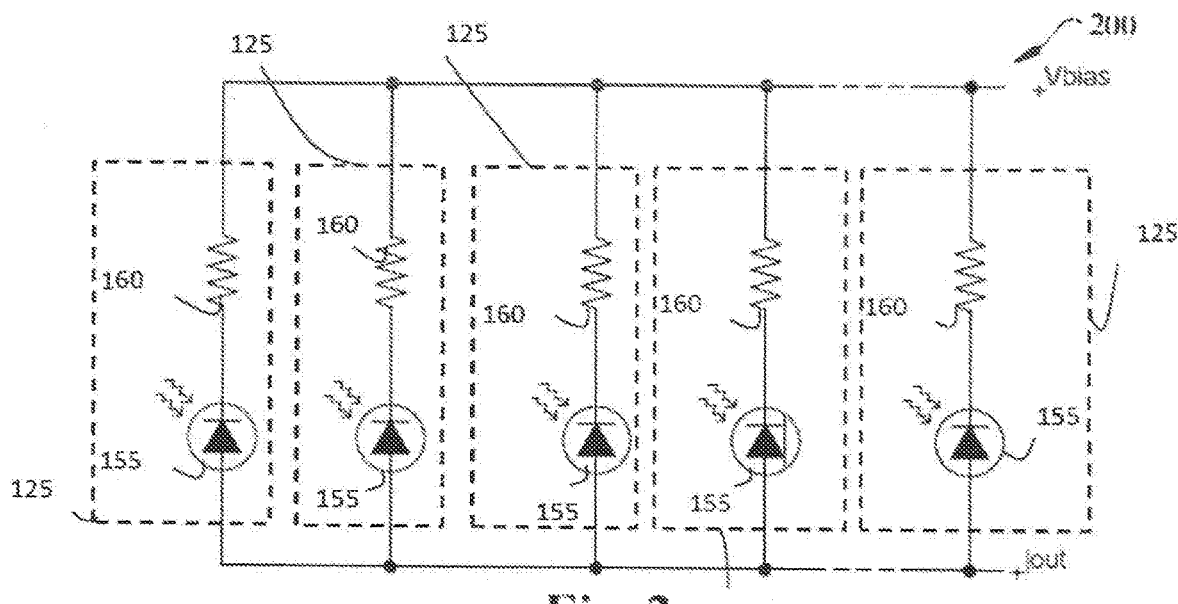
FIG. 2 is a schematic circuit diagram of an exemplary semiconductor photomultiplier.
Figure 3:
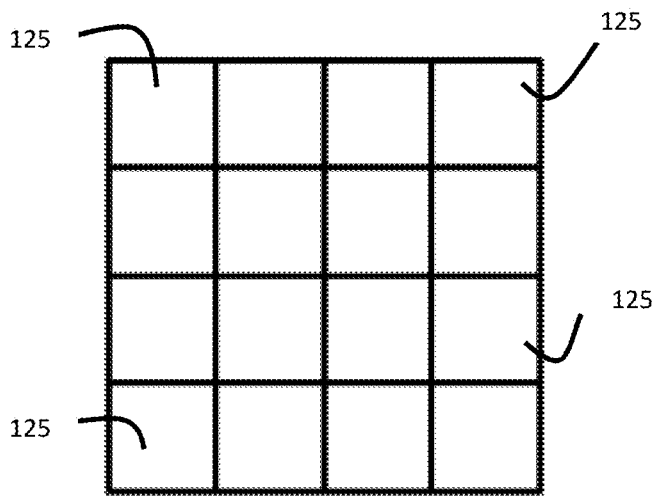
FIG. 3 is a plan view of an exemplary semiconductor photomultiplier.
Figure 4:
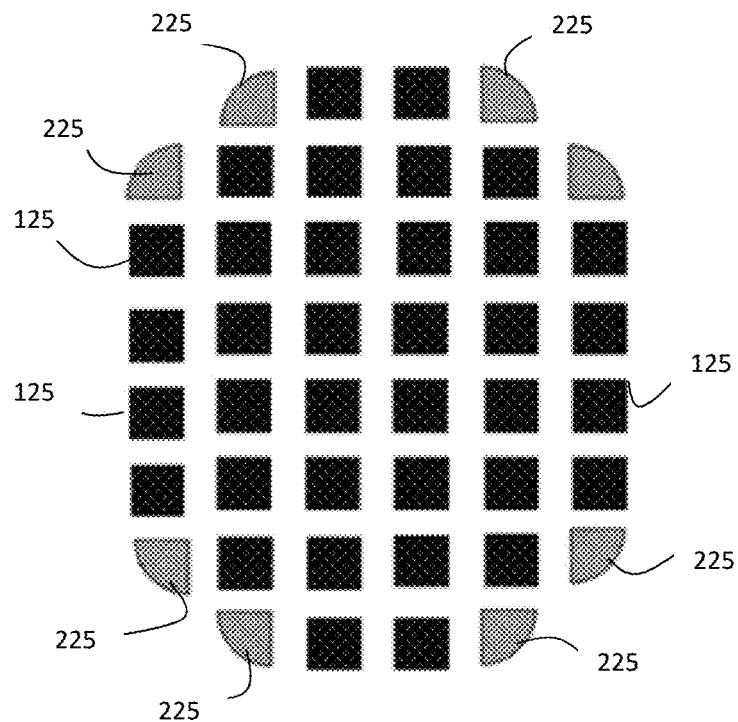
FIG. 4 is a plan view of a semiconductor photomultiplier in accordance with the present teaching.

An equivalent circuit schematic 200 is shown in FIG. 2 for a conventional semiconductor photomultiplier 100 in which the anodes of an array of photodiodes 155 are connected to a common ground electrode and the cathodes of the array are connected via current limiting resistors 160 to a common bias electrode for applying a bias voltage across the diodes.

The onset of non-light sensitive edge breakdown places a limit on the useful operating voltage range of the avalanche photodiode. Sufficient over voltage (biasing beyond initial breakdown) is typically necessary in order that avalanche probabilities 15 achieve levels that allow a substantial PDE to be achieved. When sufficient over voltage is not possible due to the onset of non-light sensitive edge breakdown then PDE is reduced from what the device is ultimately capable of achieving. The device is limited in operating voltage to levels that may not allow high avalanche probabilities to be achieved within the device and the architecture's full potential is not realised.

$$G = \frac{C \cdot \Delta V}{q}$$

Where:
G is the gain of the microcell;
C is the capacitance of the microcell;
$\Delta V$ is the over-voltage; and
q is the charge of an electron.

Noise is a general term that may cover all sources of unwanted signal in the system and is superimposed onto the measured signal. The noise ultimately imposes a limit on the smallest signal that can be measured. The main source of noise in an SiPM is the dark count rate (DCR), which is primarily due to thermally generated electrons that go on to create an avalanche in the high field region. The DCR is the average rate of registered counts without any incident light. The DCR determines the minimum count rate at which the current signal is dominantly caused by real photons. The signals resulting from the breakdown of the microcell 125, due to either photoelectrons or thermally generated electrons, are identical. Therefore, these electrons form a source of noise at the single photon level. If a threshold can be set above the single photon level, false triggers from the noise can be avoided, but the dark counts will always form a contribution to the measured signal.

The semiconductor photomultiplier 100 consists of an array of repeating structures called microcells 125. Each microcell 125 generates a highly uniform and quantized amount of charge every time the microcell 125 undergoes a Geiger breakdown. The gain of a microcell 125 (and hence the detector) is defined as the ratio of the output charge to the charge on an electron. The output charge can be calculated from the overvoltage and the microcell capacitance.

The present inventors have realised that by selecting instances of the microcells 225 in the device that are responsible for limiting the operating voltage range are modified in order to extend the potential operating voltage range. The sub-set of microcells 225 modified are the microcells that are responsible for the onset of edge breakdown. The result is a device with two types of microcells instead of the usual one type. The new, second type of microcell 225 is modified to allow it to perform differently to the microcells of the first type 125. These microcells 225 have modified geometry which relieves the electric fields within the microcell. Optionally, the sub-set of microcells 225 have modified patterning of processing compared to the microcells 125 in order to minimise non-uniformity to other operating parameters of the device. The above modifications to the microcells 225 facilitate the device to operate in the desired light sensitive mode to much higher over voltages than would otherwise be possible and so achieve better avalanche probabilities and better light detection efficiencies. The second type of microcells 225 are typically located at the outer periphery of the array such as corners locations of the matrix of microcells.

It is not intended to limited the location where the second type of microcell 225 are placed in the array. Thus the second type of microcells 225 may be located in non-corner regions of the array. The second type of microcells 225 may be located at locations of the array which have within them a region where an electric field is above a predetermined level and which have a lower breakdown compared to the first type of microcells 125 located at locations of the array which have within them a region where the electric field is below a predetermined level. In an exemplary embodiment, the predetermined level is in the range of 20 volts to 60 volts. The breakdown voltage of the microcells having lower breakdown voltage compared to the breakdown voltage of microcells having higher breakdown voltage is given by the equation:

$$\left(\frac{V_{SP}}{V_{BD}}\right) = \left[n^2 + 2.14n^{6/7} - (n^3 + 3n^{13/7})^{2/3}\right]$$

where
$V_{BD}$ is the breakdown voltage of the microcells having higher breakdown;
$V_{SP}$ is the breakdown voltage of the microcells having lower breakdown;

$n \sim r_j/W_{DM}$;

where $W_{DM}$ is equal to a depletion width of a plane junction; and
$r_j$ is a radius of curvature of a junction.

It will be appreciated by those skilled in the art that either the first type of microcell 125 or the second type of microcell 225 is located at first locations of the array while the other one of the first type of microcell 125 and the second type of microcell 225 is located at second locations of the array. The first locations and the second locations are associated with different electric fields. The electric field associated with one of the first and second locations is greater than the electric field associated with the other one of the first and second locations.

At least some of the microcells located at locations at an outer periphery of the array are associated with a higher electric field than other microcells which are not located at locations at the outer periphery of the array. In the exemplary embodiment, one or more second type microcells 225 located at corner locations of an outer periphery of the array are associated with a higher electric field than one or more first type microcells 125 which are not located at corner locations of the outer periphery of the array.

Figure 5:
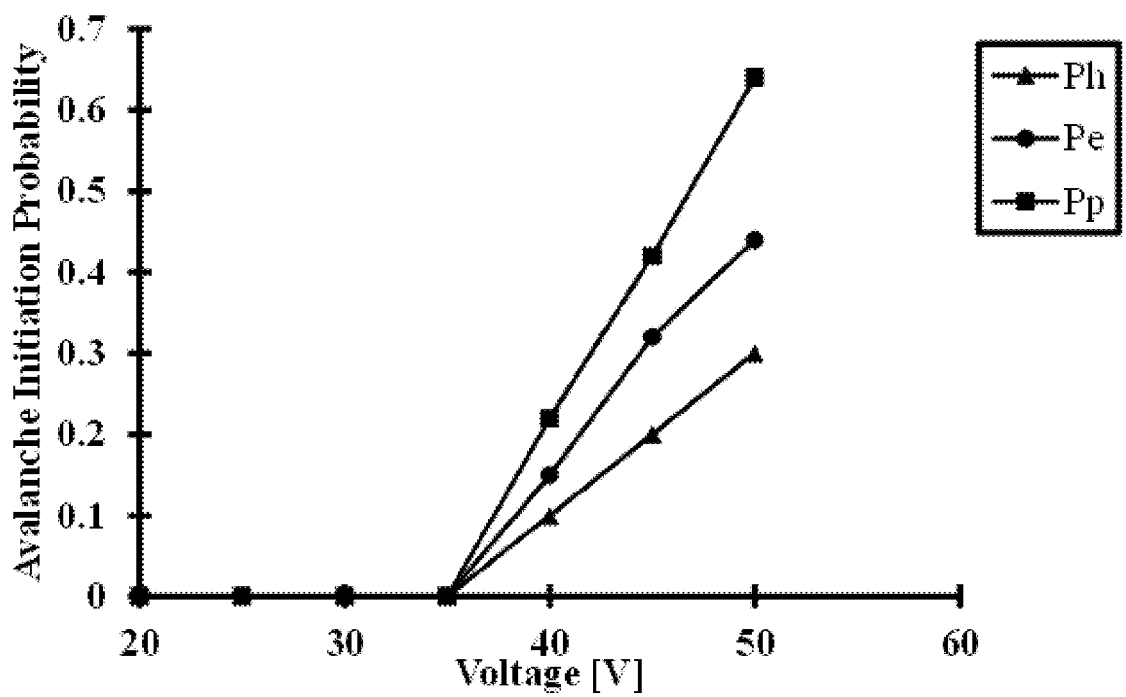
FIG. 5 is a graph of avalanche initiation probability (AIP) for electrons, holes and joint for a diode verses applied reverse bias.
Figure 6:
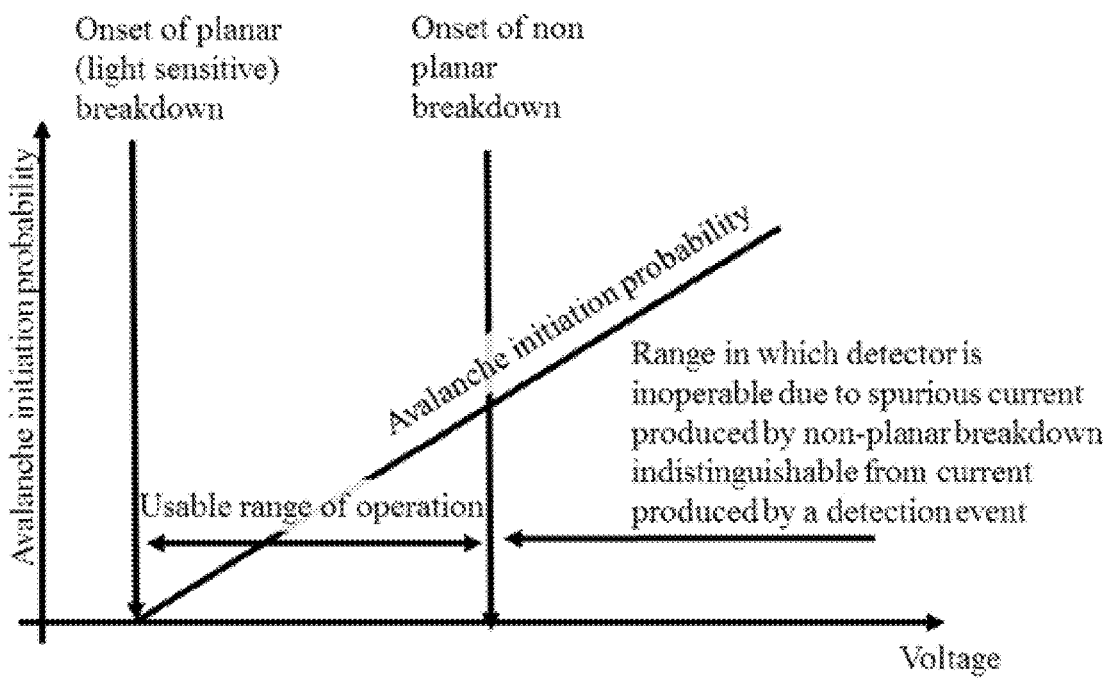
FIG. 6 is a graph illustrating the operating voltage range of a normal detector without modified microcells and increasing detector efficiency due to the increasing avalanche probability with increasing applied reverse bias.
Figure 7:
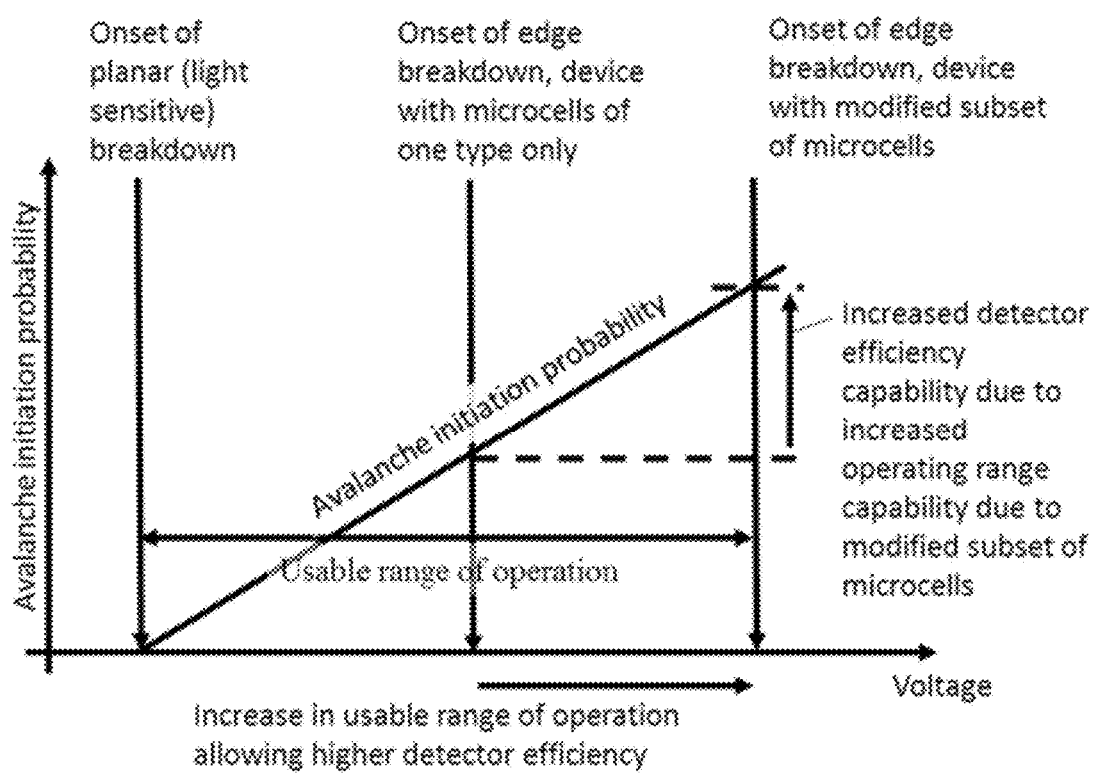
FIG. 7 is a diagram illustrating the increase in the operating voltage range of a detector incorporating the subset of modified microcells.

FIG. 5 is a graph of avalanche initiation probability (AIP) for electrons, holes and joint for a diode verses applied reverse bias. The AIP and hence the detector efficiency increases with increasing operating voltage. FIG. 6 illustrates the operating voltage range of a normal detector without modified microcells 225 and increasing detector efficiency due to the increasing avalanche probability with increasing applied reverse bias. The limitation on the operating range due to the onset of non-light sensitive edge breakdown is also depicted. The onset of edge breakdown adds spurious current to the detection signal indistinguishable from current due to real detection events rendering the detector inoperable. Increasing the voltage at which this non-light sensitive, edge breakdown is initiated increases the operating voltage capability of the detector allowing it to be operated at voltages where the AIP is higher. A detector with an increased efficiency is thus realized. Alternatively, the junction breakdowns can be lowered and the modified device operated at a higher over voltage (voltage above onset of initial breakdown) and hence higher detection efficiency but at the same absolute operating voltage as the standard device with higher initial breakdown but lower overvoltage capability. FIG. 7 is a diagram illustrating the increase in the operating voltage range of a detector incorporating the subset of modified microcells 225. The operating range of the device is increased by modifying microcells that are responsible for limiting the operating range capability of the device. This allows the device to be operated at a voltage above that possible for a conventional device. This means that the device can be operated in a regime where a higher Avalanche Initiation Probability.

Figure 8A:
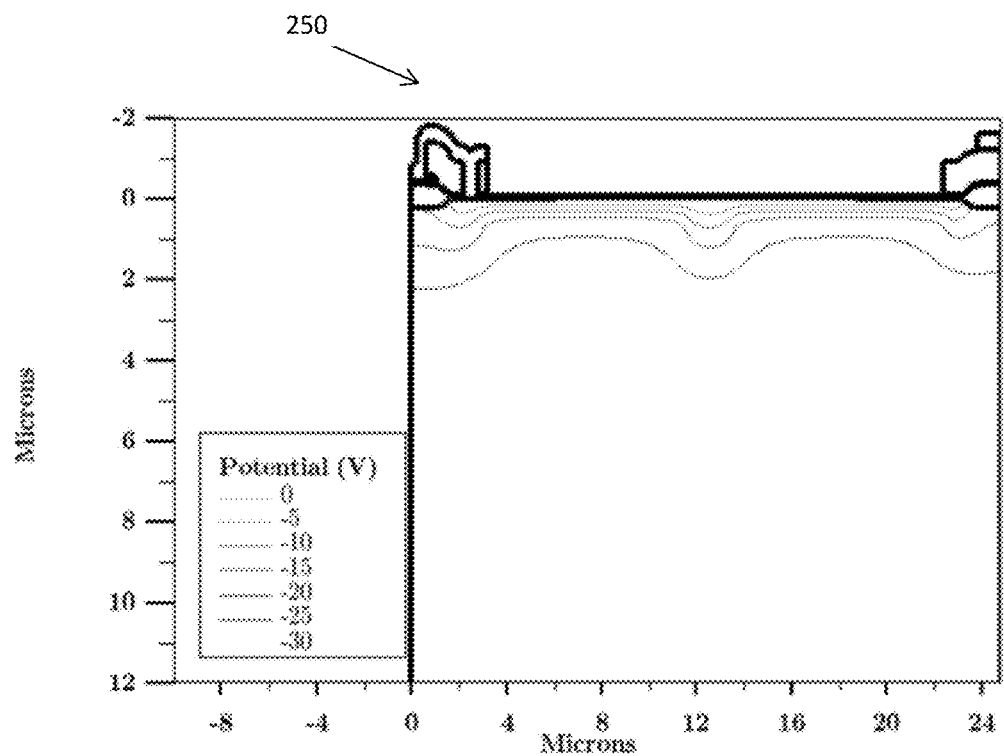
FIGS. 8A and 8B are computer simulations showing internal distribution of equipotential lines in a 2D cross-section of an SiPM for microcells in two regions of the array.
Figure 8B:
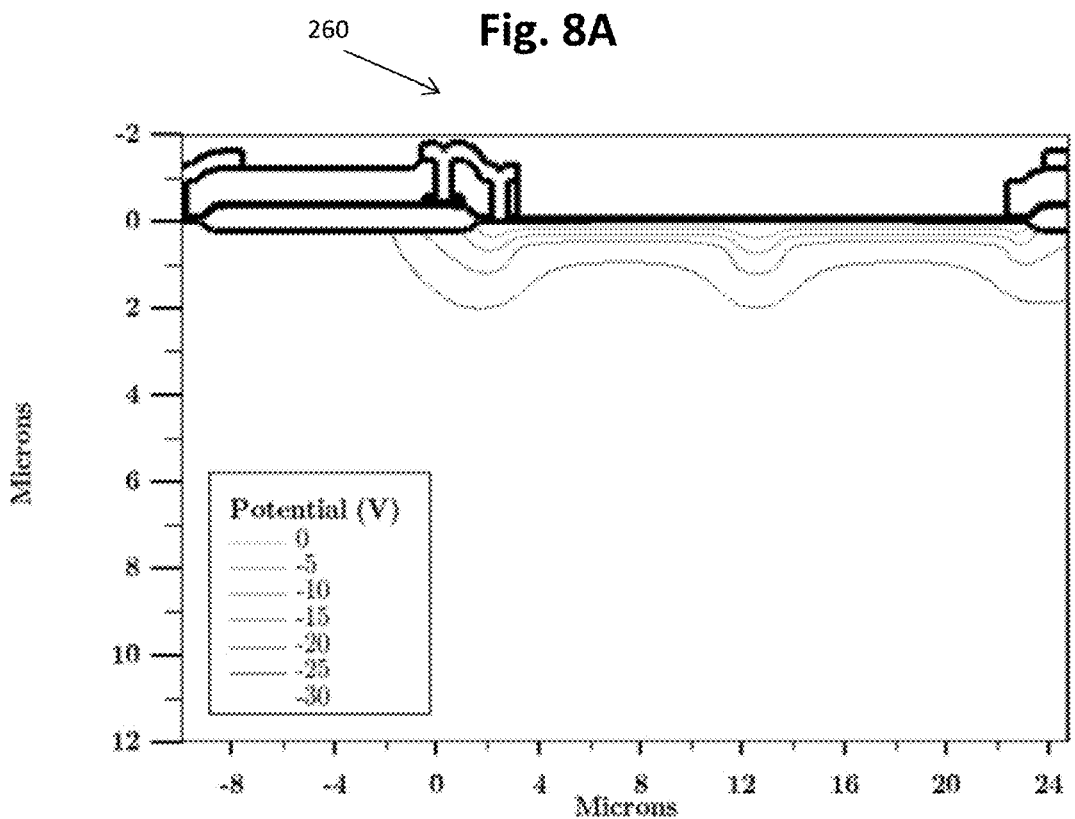

FIGS. 8A and 8B are computer simulations showing internal distribution of equipotential lines in a 2D cross-section of an SiPM for microcells in two regions of the array: a non-edge of array microcell 250 as illustrated in FIG. 8A and an edge of array microcell 260 as illustrated in FIG. 8B. For non-edge of array microcells 250 the surface potential between micro-cells is significantly lower than the terminal applied potential but for edge of array micro-cells 260 the surface potential rises to the terminal potential. This means that there is a higher voltage drop at the edge of array microcells 260 than for non-edge of array microcells 250. Therefore, edge of array microcells will have higher edge of micro-cell electric fields than non-edge of array micro-cells, and reach the critical electric field for impact ionization sooner. As a consequence, edge microcells 260 will begin to contribute spurious non-light sensitive current to the device 10 output sooner than non-edge of array micro-cells 250 and render the detector inoperable while non-edge of array microcells 250 can still function successfully as photon detectors. In an analog SiPM with all microcell outputs summed, the entire detector is rendered inoperable by spurious current emanating from a single micro-cell. Thus the spurious current emanating from the edge microcells 260 limits the operating 15 voltage range of the whole device which is undesirable.

Figure 9:
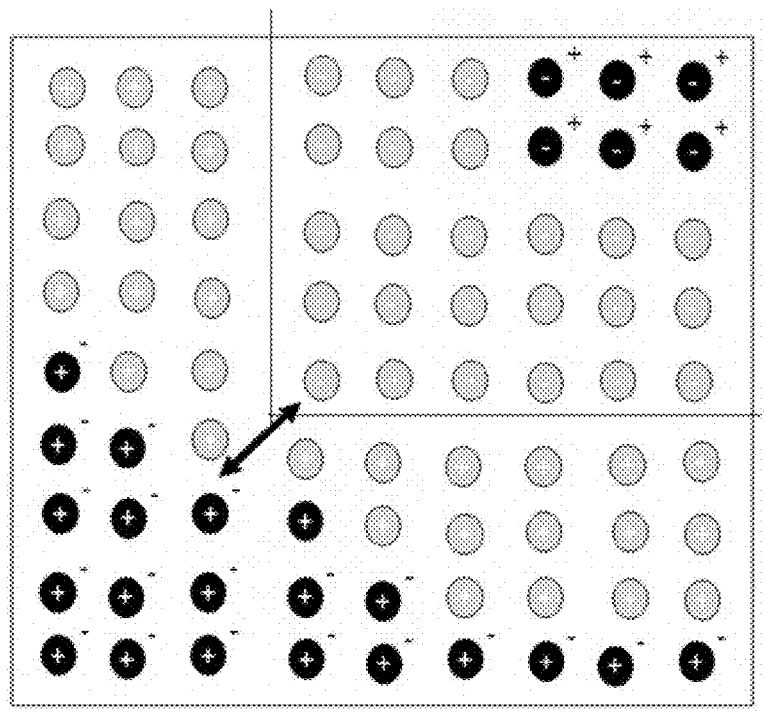
FIG. 9 is a two dimensional representation of a depletion region formation for a planar (2-D) junction.

FIG. 9 is a two dimensional representation of a depletion region formation for a planar (2-D) junction. A junction is a plane which defines the transition of the Silicon type from n (excess of free electrons) to p (excess of free holes). When a detector is biased in operation there is always a junction within the active volume (region where there's an increased electric field). The detector architecture is carefully defined to maximise the plan-view area where the device is active. A junction under reverse bias forms a region devoid of free carriers around the junction, a depletion region. Non-mobile negative charge centers consisting of acceptor atoms that have been stripped of their holes form on the p-type side of the junction and are balanced by a number of stationary positive charge centers consisting of donor atoms that have been stripped of their mobile electrons on the n-type side of the junction. With junction curvature the depletion distance on the enveloping side of the junction is smaller at the junction corner to deplete a given number of dopant atoms. This means that the distance over which the junction voltage is dropped is smaller at junction corners i.e. the Electric Field is higher (Electric Field=Volts/meter). The tighter a junction curvature the greater this effect and so the lower the terminal applied voltage for that junction that the critical field for avalanche breakdown is reached internally in the junction.

Figure 10:
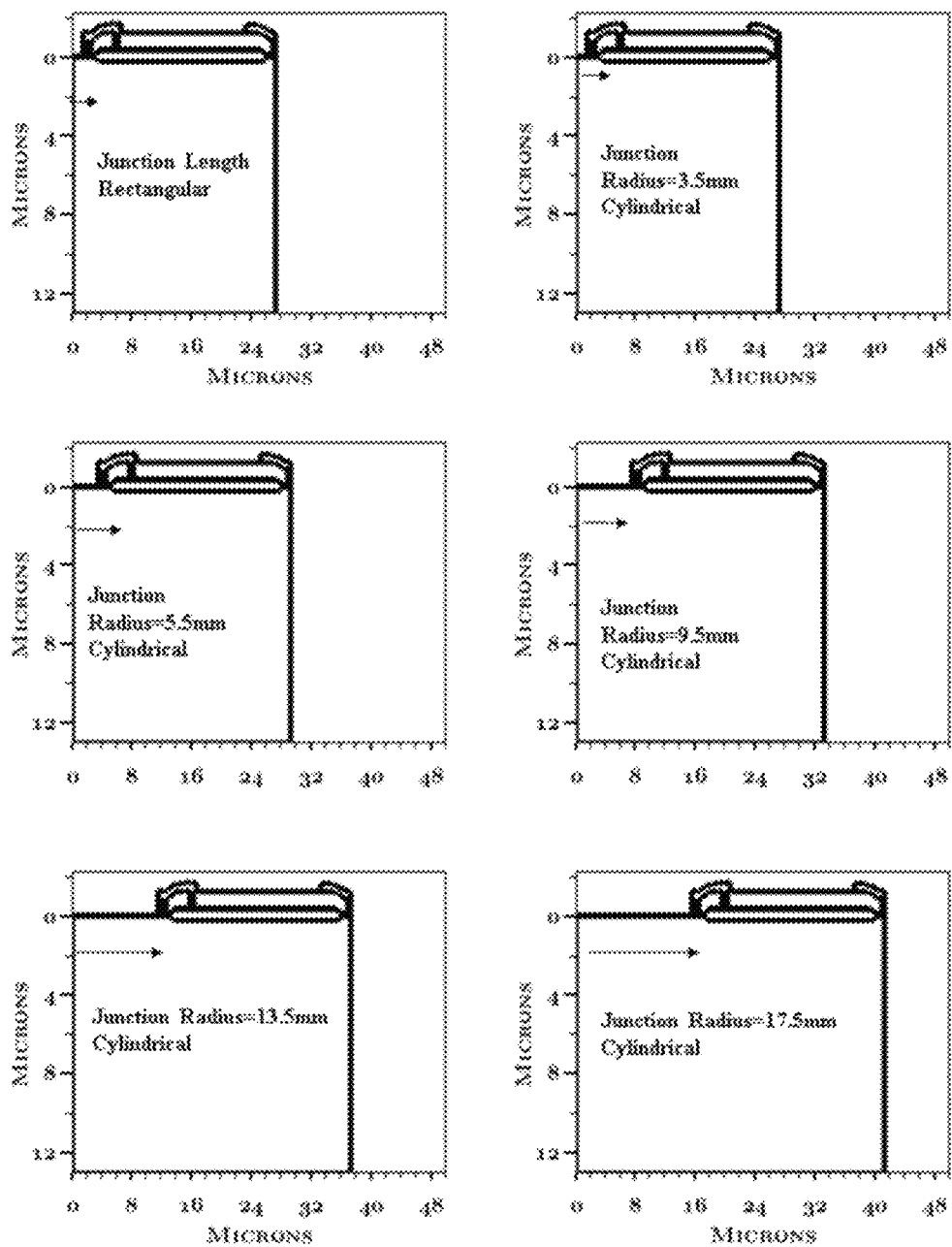
FIG. 10 illustrates exemplary structures produced to quantify the effect of junction curvature on micro-cell breakdown.

FIG. 10 illustrates exemplary structures to quantify the effect of junction curvature on microcell breakdown. Breakdown simulations 5 are performed on the structure to determine the terminal voltage required to get to breakdown i.e. achieve the critical Electric field for the Silicon lattice at a point internally in the structure. Simulations using cylindrical co-ordinates are performed on a range of structures with varying junction curvature as illustrated. The terminal applied voltage at which the 10 critical electric field is reached internally is manifested as an increase in current. The baseline junction leakage before breakdown increases with junction radius as the junction area is increasing.

Figure 11:
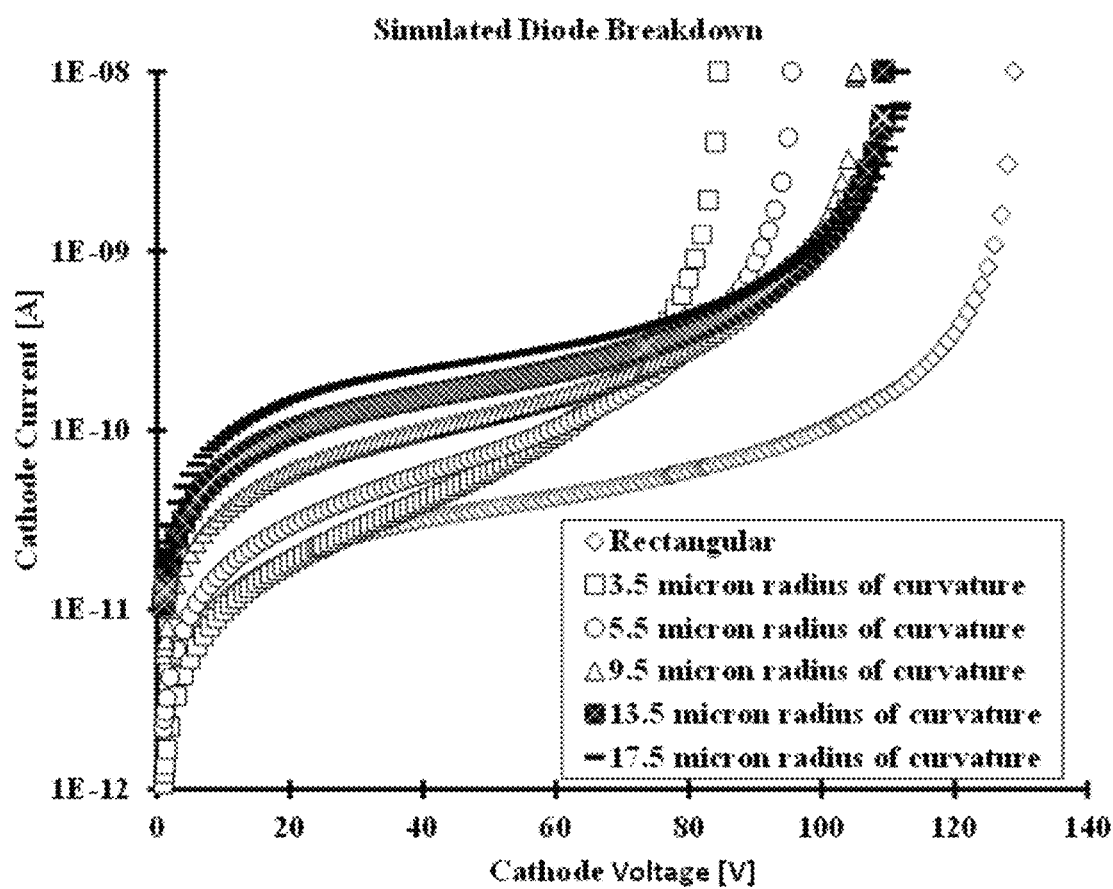
FIG. 11 illustrates the reduction in junction breakdown due to corner curvature.
Figure 12:
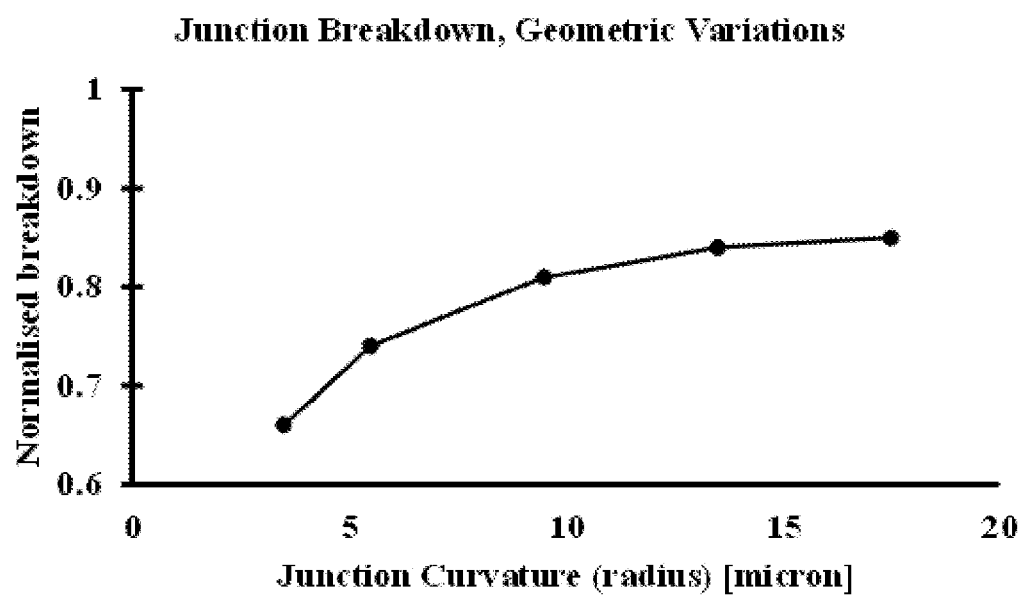
FIG. 12 illustrates that the voltage operating range is increased by modification of weak micro-cells within detector.

The graph of FIG. 11 illustrates the reduction in junction breakdown due to modified microcells with junction curvature. The rectangular co-ordinate simulation shows the maximum possible 2D breakdown. The junction breakdown is lower with reducing junction curvature. Essentially a device with microcells is limited in operating voltage (and hence ATP) to 80 volts in this example. With modified corner microcells to increase junction curvature the operating voltage ceiling may be increased to 105 Volts. This allows the planar light sensitive device (the detector) to operate at much higher efficiencies. The graph of FIG. 12 illustrates that the voltage operating range is increased by modification of corner microcells within detector.

Figure 13:
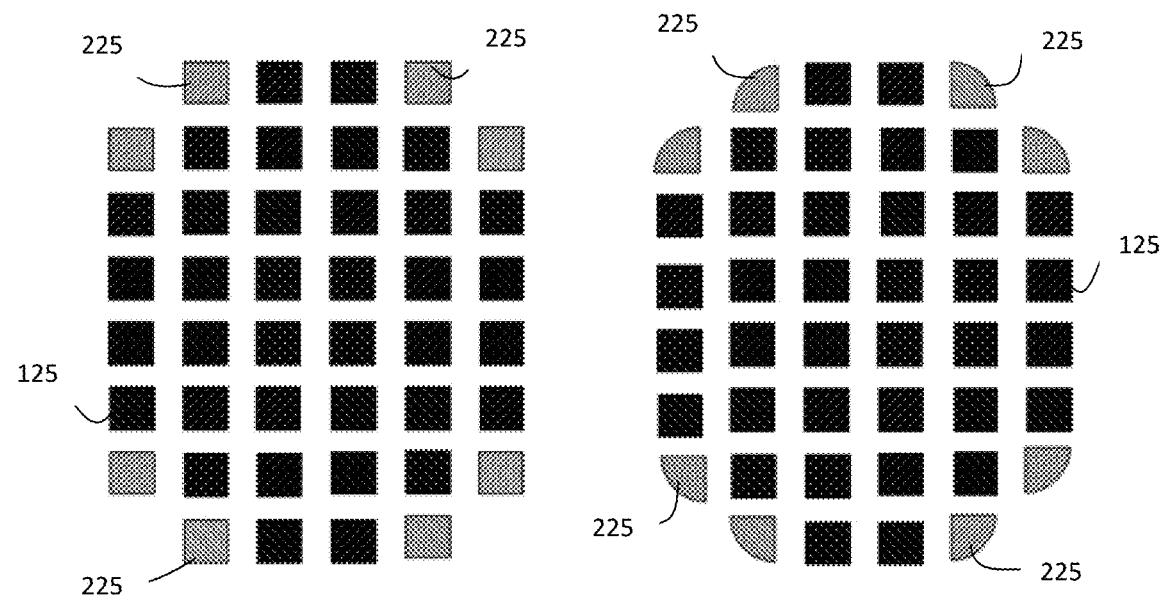
FIG. 13 illustrates a detector layout showing microcell array, with operating range limiting microcells shown in grey and a detector layout with modified subset of microcells to allow higher detector efficiency due to wider operating range.

FIG. 13 illustrates a detector layout showing a microcell array, with operating range limiting microcells 125 shown in grey and a detector layout with modified subset of microcells 225 to allow higher detector efficiency due to wider operating range. Junction curvature at the device corner microcells 225 results in the onset of corner, non-light sensitive breakdown at these microcells resulting in the production of spurious current indistinguishable from current due to real detection events. Modifying the definition of the processing step that determines junction curvature for weak microcells to increase their curvature and hence breakdown voltage results in a device that can operate to a higher voltage. Without this modification to corner microcells spurious current from the weak microcells would render the detector inoperable above a certain voltage and limit the operating capability and detector efficiency of the device. For the optimized device the corner microcells 225 are modified to be of a different type that the other microcells 125 in the device. This results in an increase in the operating voltage capability and hence detector efficiency.

Figure 14:
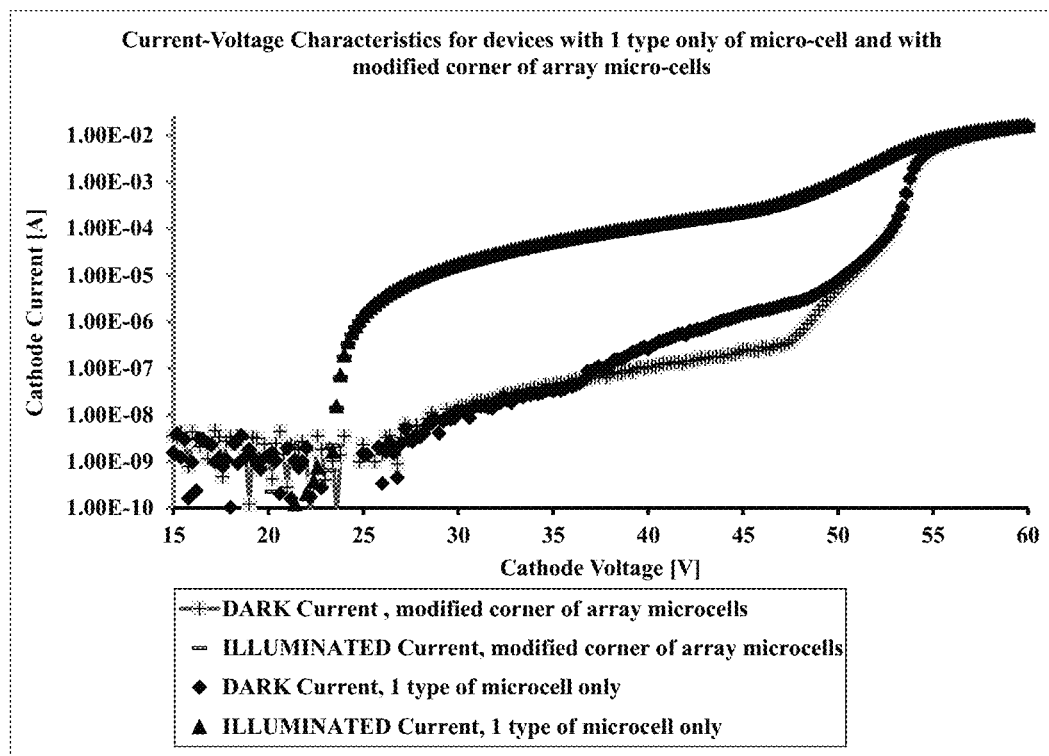
FIG. 14 illustrates a reduction in dark current for device with modified curvature for corner of array micro-cells towards the high end of operating range.

The graph of FIG. 14 illustrates a reduction in dark current for device with modified curvature for corner of array microcells 225 towards the high end of voltage operating range. Measurements of the device with conventional corner of array micro-cells 125 show an on-set of high levels of dark current from 38 volts. For the device with modified corner of array microcells 225 the onset of high levels of dark current from 47 Volts.

Figure 15:
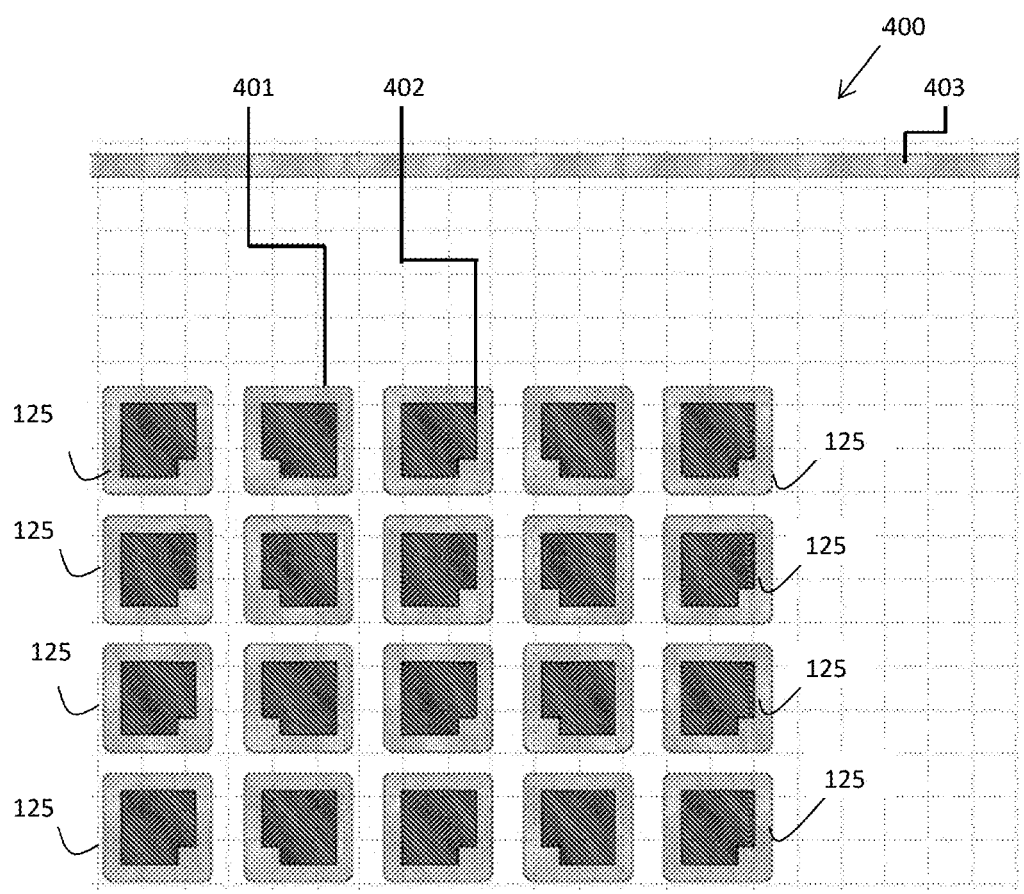
FIG. 15 illustrates a layout of an exemplary silicon photomultiplier.
Figure 16:
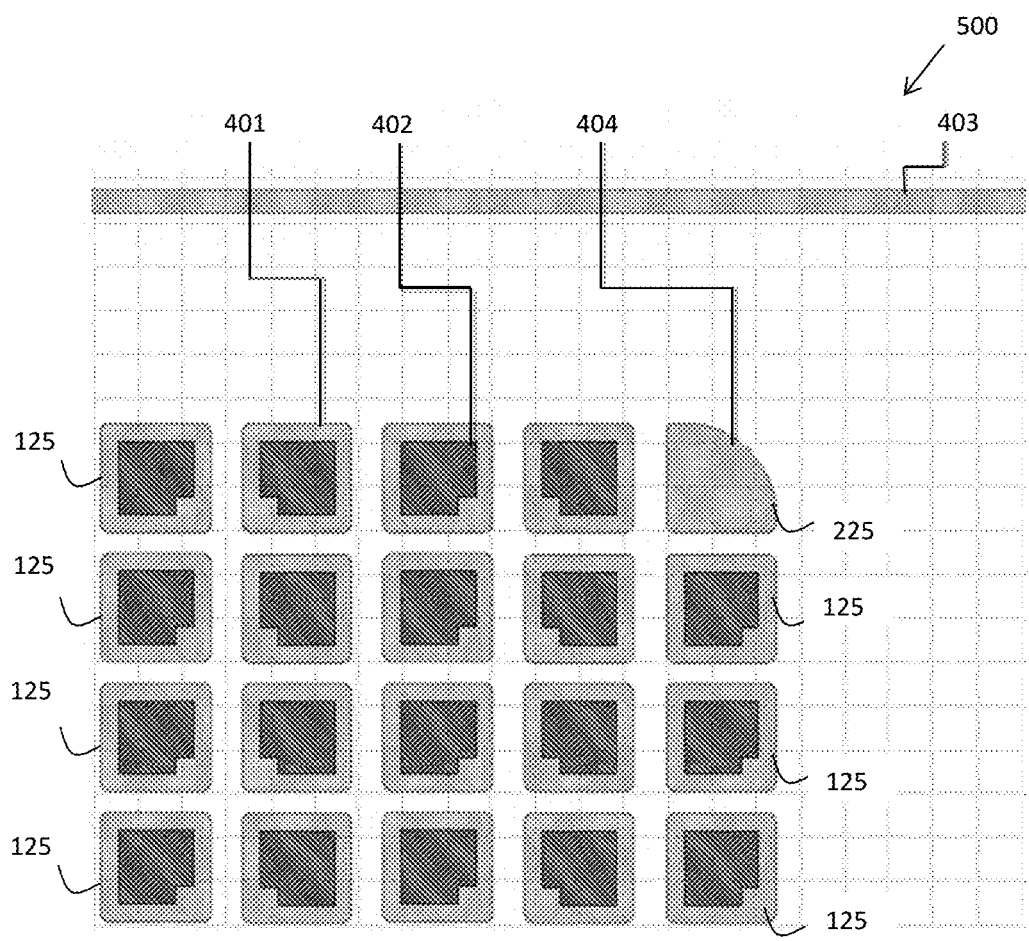
FIG. 16 illustrates a layout of an exemplary silicon photomultiplier in accordance with the present teaching.

FIG. 15 illustrates an exemplary silicon photomultiplier layout consisting of an array of photosensitive microcells 125. Each microcell 125 consists of a region 401 that defines the junction area of the individual microcell 125, and a region 402 which defines a photosensitive region of the microcell 125. The region 403 defines the edge of the microcell array. FIG. 16 illustrates another exemplary silicon photomultiplier layout 500 which consists of an array of microcells having a first type 125 and a second type 225. The second type 225 which is located at a corner of the array has been modified to increase the useful voltage operating range of the photomultiplier. The second type of microcell 225 at the corner of the array is of a different type than the first type microcells 125 which are not at the corner of the array. Both the first and second type of microcell 125, 225 consists of a region 401 that defines the junction area of the microcell. In the second type of microcell 225 the region 404 defining the junction area is of a different shape that the other microcells 125 in the array. A region 402 defines the photosensitive region of the first type of microcell 125. This photosensitive region is absent from the second type of microcell 225. Thus the second type of microcell 225 is not photosensitive while the first type of microcell 125 is photosensitive. The geometry of the second type of microcell 225 is modified compared to the first microcell. In the exemplary embodiment, the second type of microcell 225 has a reduced junction area compared to the junction area of the first type of microcell. This results in the microcell 225 having a reduced junction capacitance and hence reduced gain compared to the microcell 125. This would lead to non-uniformity in the sensor output with detection events from the modified corner microcells having reduced photocurrent. To remove this unwanted non-uniformity the second type of microcells 225 that have modified junction geometry are further modified so that the material layers deposited over the microcell 225 are left in place instead of being removed as is the case for all the first type of microcells 125. Thus the material over the microcell 225 renders the microcell cell 225 to be non-photosensitive. A region equivalent to 402 in the non-corner microcells 125 is not present in the corner microcell 225. This leads to the modified corner microcells 225 being non-photosensitive and the detector operating in a more uniform manner. The region 403 defines the edge of the microcell array.

The sensor output from the array 500 is a photocurrent, and the total charge Q generated from an event may be given by the equation:

$$Q = N_{fired} \cdot G \cdot q$$

$N_{fired}$ is the number of fired microcells
G is the gain of the microcell
q is the charge on an electron The gain, G, can be calculated from the overvoltage $\Delta V$, the microcell capacitance C, and the electron charge, q:

$$G = C \cdot \Delta V \cdot q$$

The microcell capacitance, C is a function of the permittivity of Silicon, $e_{silicon}$, the depletion width at the operating Voltage, $w_{depletion}$ and the junction area of the microcell, A.

$$C = \frac{e_{silicon} \cdot A}{w_{depletion}}$$

It will be appreciated by those of ordinary skill in the art that the silicon photomultiplier may be fabricated on the substrate using conventional semiconductor processing techniques and may include for example, but not limited to, deposition, implantation, diffusion, patterning, doping, and etching. Patterned layers of conducting material, insulating material and doped areas of semiconductor form the structure of the microcells. The method of fabrication may include the steps of providing an array of interconnected photosensitive microcells; wherein the array comprises at least a first type of microcell having a first junction region of a first geometric shape; and a second type of microcell having a second junction region of a second geometric shape. In one example, at least one of the first and second geometric shapes define an arcuate shape. In another example, both the first and second geometric shapes define an arcuate shape. Advantageously, the first and second geometric shapes define arcuate shapes of different radii. Locations of the array which have a higher electric field than other locations of the array are provided with microcells with junction regions of area greater that the junction regions of microcells located at the other locations. Locations of the array which have a higher electric field than other locations of the array are provided with microcells with junction regions of radii greater that the junction regions of microcells located at the other locations. In a further example, at least one of the first and second geometric shapes define an arcuate shape; while the other one of the first and second geometric shapes define a non-arcuate shape. Advantageously, the first junction region and second junction region are associated with different breakdown voltages. The first junction region and second junction region have different levels of light sensitivity. The microcells located at the first locations of the array have a lower light sensitivity compared to the microcells located at the second locations of the array.

The first junction region and second junction region have different levels of gain. The microcells 225 located at the first locations of the array have a higher gain compared to the microcells located at the second locations of the array. The first junction region and second junction region have different levels of capacitance. The microcells 225 located at the first locations of the array have a lower capacitance compared to the microcells 125 located at the second regions of the array. The transmittance associated with one or more layers of material covering the microcells 225 located at the first locations is lower than the transmittance associated with one or more layers of material covering the microcells 125 located at the second locations. In one example, the arcuate shape comprises at least one of a cylindrical shape, and a spherical shape. The arcuate shape may have a predetermined radius. In another example, at least two of the microcells have junctions of arcuate shape with different radii. The area of the first junction region and the second junction region may be different. The junction area of the microcell 225 located at the first 5 locations is less than the junction area of the microcell 125 located at the second locations. The junction areas of at least two microcells located at the first locations may be different.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

We claim:

1. A semiconductor photomultiplier comprising:
an array of interconnected microcells; wherein the array comprises at least a first type of microcell having a first junction region of a first geometric shape; and a second type of microcell having a second junction region of a second geometric shape, wherein said second geometric shape is different from said first geometric shape; and
wherein the second type of microcell is located at second locations of the array that are corner locations of an outer periphery of the array and the first type of microcell is located at first locations of the array that are not located at corner locations of the outer periphery of the array,
wherein the second junction regions of the second type of microcell located at the corner locations of the array have radii greater than the first junction regions of the first type of microcell.

2. The semiconductor photomultiplier as claimed in claim 1, wherein the microcells located at locations of the array which have within them a region where an electric field is above a predetermined level have a lower breakdown voltage compared to the microcells located at locations of the array which have within them a region where the electric field is below a predetermined level.

3. The semiconductor photomultiplier as claimed in claim 2, wherein the predetermined level is in the range of 20 volts to 60 volts.

4. The semiconductor photomultiplier as claimed in claim 2, wherein the breakdown voltage of the microcells having lower breakdown voltage compared to the breakdown voltage of microcells having higher breakdown voltage is given by the equation:

$$\left(\frac{V_{SP}}{V_{BD}}\right) = \left[n^2 + 2.14n^{6/7} - (n^3 + 3n^{13/7})^{2/3}\right]$$

where
$V_{BD}$ is the breakdown Voltage of the microcells having higher breakdown;
$V_{SP}$ is the breakdown Voltage of the microcells having lower breakdown;

$n \sim = r_j/W_{DM}$;

where $W_{DM}$ is equal to a depletion width of a plane junction; and
$r_j$ is a radius of curvature of a junction.

5. The semiconductor photomultiplier as claimed in claim 1, wherein one or more microcells is located at locations at an outer periphery of the array are associated with a higher electric field than one or more microcells which are not located at locations at the outer periphery of the array.

6. The semiconductor photomultiplier as claimed in claim 1, wherein at least one of the first and second geometric shapes define an arcuate shape.

7. The semiconductor photomultiplier as claimed in claim 6, wherein both the first and second geometric shapes define an arcuate shape.

8. The semiconductor photomultiplier as claimed in claim 7, wherein the first and second geometric shapes define arcuate shapes of different radii.

9. The semiconductor photomultiplier as claimed in claim 6, wherein at least one of the first and second geometric shapes define an arcuate shape, while the other one of the first and second geometric shapes define a non-arcuate shape.

10. The semiconductor photomultiplier as claimed in claim 6, wherein the arcuate shape comprises at least one of a cylindrical shape, and a spherical shape.

11. The semiconductor photomultiplier as claimed in claim 6, wherein the arcuate shape has a predetermined radius.

12. The semiconductor photomultiplier as claimed in claim 6, wherein at least two of the microcells have junctions of arcuate shape with different radii.

13. The semiconductor photomultiplier as claimed in claim 6, wherein the areas of the first junction region and the second junction region are different.

14. The semiconductor photomultiplier as claimed in claim 1, wherein locations of the array which have a higher electric field than other locations of the array are provided with microcells with junction regions of area greater that the junction regions of microcells located at the other locations.

15. The semiconductor photomultiplier as claimed in claim 1, wherein the first junction region and second junction region are associated with different breakdown voltages.

16. The semiconductor photomultiplier as claimed in claim 1, wherein the first junction region and second junction region have different levels of light sensitivity.

17. The semiconductor photomultiplier as claimed in claim 16, wherein the microcells located at the first locations of the array have a lower light sensitivity compared to the microcells located at the second locations of the array.

18. The semiconductor photomultiplier as claimed in claim 1, wherein the first junction region and second junction region have different levels of gain.

19. The semiconductor photomultiplier as claimed in claim 18, wherein the microcells located at the first locations of the array have a lower gain compared to the microcells located at the second locations of the array.

20. The semiconductor photomultiplier as claimed in claim 1, wherein the first junction region and second junction region have different levels of capacitance.

21. The semiconductor photomultiplier as claimed in claim 20, wherein the microcells located at the first locations of the array have a lower capacitance compared to the microcells located at the second regions of the array.

22. The semiconductor photomultiplier as claimed in claim 1, wherein the transmittance associated with one or more layers of material covering the microcells located at the first locations is lower than the transmittance associated with one or more layers of material covering the microcells located at the second locations.

23. The semiconductor photomultiplier as claimed in claim 1, wherein the junction area of the microcell located at the first locations is less than the junction area of the microcell located at the second locations.

24. The semiconductor photomultiplier as claimed in claim 23, wherein the junction area of at least two microcells located at the first locations are different.

25. A semiconductor photomultiplier comprising:
an array of interconnected microcells; wherein the array comprises at least a first type of microcell having a first junction region of a first geometric shape, and a second type of microcell having a second junction region of a second geometric shape, wherein said second geometric shape is different from said first geometric shape; and
wherein one of first type of microcell and the second type of microcell is photosentive while the other one of the first type of microcell and the second type of microcell is non-photosentive.

26. A substrate comprising:
an array of interconnected microcells; wherein the array comprises at least a first type of microcell having a first junction region of a first geometric shape; and a second type of microcell having a second junction region of a second geometric shape, wherein said second geometric shape is different from said first geometric shape, wherein microcells at corners of an outer periphery of said array comprise said second type of microcell, and said second type of microcell has an arcuate shape whereas said first type of microcell has a non-arcuate shape.

27. The substrate of claim 26, wherein:
the first type of microcell is photosentive while the second type of microcell is non-photosentive.

28. The substrate of claim 27, wherein:
the first type of microcell has a junction region and a photosensitive region within the junction region, whereas the second type of microcell has a junction region but no photosensitive region.

* * * * *